United States Patent
Miyamoto (10) Patent No.: US 7,174,502 B2
(45) Date of Patent: Feb. 6, 2007

(54) SYNCHRONIZATION ERROR DETECTION CIRCUIT

(75) Inventor: Hiromitsu Miyamoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 557 days.

(21) Appl. No.: 10/606,923

(22) Filed: Jun. 27, 2003

(65) Prior Publication Data

US 2004/0078737 A1    Apr. 22, 2004

(30) Foreign Application Priority Data

Jul. 1, 2002    (JP)    ............... 2002-192492

(51) Int. Cl.
G06F 11/00    (2006.01)
G01R 31/30    (2006.01)
G08C 25/02    (2006.01)
H04L 1/18    (2006.01)

(52) U.S. Cl. ............ 714/798; 714/744; 714/745; 714/748

(58) Field of Classification Search ............ 714/700, 714/748, 775, 798, 721, 744, 745
See application file for complete search history.

(56) References Cited

U.S. PATENT DOCUMENTS

| | | | |
|---|---|---|---|
| 4,646,312 A * | 2/1987 | Goldsbury et al. ......... | 714/763 |
| 5,349,610 A | 9/1994 | Sakamoto et al. | |
| 5,502,728 A * | 3/1996 | Smith, III ............... | 714/5 |
| 5,636,208 A * | 6/1997 | Chang et al. ............ | 370/347 |
| 5,727,035 A * | 3/1998 | Hiramatsu ................ | 375/368 |
| 5,832,031 A * | 11/1998 | Hammons, Jr. .......... | 375/262 |
| 6,856,658 B1* | 2/2005 | Baba et al. .............. | 375/355 |

FOREIGN PATENT DOCUMENTS

| | | |
|---|---|---|
| JP | 04-347931 | 12/1992 |
| JP | 04-363926 | 12/1992 |
| JP | 05-110551 | 4/1993 |
| JP | 08-008889 | 1/1996 |
| JP | 08-181685 | 7/1996 |
| JP | 2000-323981 | 11/2000 |

* cited by examiner

*Primary Examiner*—Cynthia Britt
(74) *Attorney, Agent, or Firm*—Rabin & Berdo, P.C.

(57) ABSTRACT

Synchronization errors in a received pulse train are detected by detecting rising or falling transitions in the pulse train, generating numbers in a repeating cycle having a length corresponding to the pulse rate, selecting the number generated when each transition is detected, and performing a predetermined operation on the selected numbers. The predetermined operation may include, for example, comparing the average values of the selected numbers in successive groups of transitions. Alternatively, the predetermined operation may include taking a difference between consecutively selected numbers to measure pulse widths in the pulse train. Synchronization error detection can be used to supplement data error detection and correction methods such as forward error correction and cyclic redundancy checks.

12 Claims, 8 Drawing Sheets

SYNCHRONIZATION ERROR DETECTION CIRCUIT

BACKGROUND OF THE INVENTION

1. Field of the Invention

The present invention relates to a circuit for detecting synchronization errors, and in particular to a circuit that can be usefully combined with a circuit that detects errors in data received in, for example, a digital wireless communication system.

2. Description of the Related Art

The methods generally used for data error control in digital wireless communication systems include cyclic redundancy check (CRC) codes and forward error correction (FEC).

CRC codes enable errors to be detected. Treating the individual bits of transmit data as the coefficients of a polynomial, the transmitting apparatus divides a block of transmit data by a predetermined generator polynomial, and redundantly appends the remainder to the block as a CRC code. The receiving apparatus divides the received block, including the appended CRC code, by the same generator polynomial, and checks that the result is zero. Output of a non-zero bit by the checking circuit indicates that a data error has occurred in the transmission channel.

FEC employs a type of redundant code that has both an error-detecting and an error-correcting capability. Due to the structure of the codes used, however, long burst errors present difficulties for FEC, while the CRC method can detect long burst errors with a fairly high degree of accuracy. The CRC and FEC methods are therefore most effective when they are used selectively, according to the rate of error occurrence and other channel conditions. Not infrequently, the CRC and FEC methods are used in combination.

When the CRC method is used alone, or when the FEC method is used but an error that exceeds the FEC error-correcting capability is detected, a retransmission request is sent to the transmitting apparatus.

Errors may occur in the transmission channel for various reasons, including noise radiating from surrounding areas. When the channel is a wireless channel, errors may also occur because the transmitting apparatus and receiving apparatus are too widely separated and the received radio signal is too weak. Another possible cause is clock jitter in either the transmitting communication apparatus or the receiving communication apparatus. In this case, the channel is regarded as including part of the communication apparatus itself.

The coding theory on which existing methods of error control such as the CRC and FEC methods are based is predicated on the assumption of perfect synchronization between the transmitting and receiving apparatus. If this assumption is not true, error control performance falls short of theoretical expectations.

In actual communication, this assumption is often false. Imperfect synchronization can lead to errors known as bit drop-outs or drop-ins. A drop-out occurs when a bit in the original data stream is deleted in the transmission channel. A drop-in occurs when an originally nonexistent bit is inserted into the data stream in the transmission channel.

Since the CRC and FEC methods assume perfect synchronization, from their coding-theoretical viewpoint, even a single bit drop-out (or drop-in) can cause errors in all the succeeding bits, including the redundant check codes, because a drop-out shifts all succeeding bits forward by one position and a drop-in shifts all succeeding bits back by one position. This can create a very large burst error that can easily exceed not only the FEC error-correcting capability but also the CRC error-detecting capability, making proper error detection impossible.

When the error detection function is realized by the CRC method alone, for example, a typical generator polynomial is $g(D)=D^{16}+D^{12}+D^5+1$. The redundant code generated by this polynomial has sixteen bits, so the number of different check patterns is 65,536 ($=2^{16}$). If errors occur randomly, the probability of a wrong CRC indication is only 1/65,536. More specifically, this is the probability that a random sequence of erroneous bits will defeat the CRC check by fortuitously generating the correct (zero) CRC result. When an error is caused by a bit drop-out or drop-in, however, the probability of a wrong CRC indication is much higher. As a result, it becomes difficult to maintain good communication quality in the face of synchronization errors with their attendant bit drop-ins and drop-outs.

SUMMARY OF THE INVENTION

A general object of the present invention is to improve communication quality;

A more specific object is to avoid the occurrence of unrecognized data errors due to faulty synchronization.

The invented synchronization error detection circuit includes a transition detector that detects rising or falling transitions in a received pulse train, and a cyclic number generator that generates numbers in a cyclically repeating series having a cycle length corresponding to the pulse rate in the pulse train. A selector selects the number generated when a transition is detected. A predetermined operation is performed on the numbers selected in this way to detect synchronization errors.

The predetermined operation may include calculating average values of the selected numbers over groups of transitions, and comparing the average values of successive groups. A synchronization error can then be detected when the difference between successive average values exceeds a predetermined threshold value.

Alternatively, the predetermined operation may include taking a difference between the selected numbers associated with a consecutive pair of transitions to obtain a pulse width value. In this case, a synchronization error can be detected when the pulse width value is, for example, less than a predetermined threshold value.

The synchronization error detection circuit may include a retransmission request generator for sending a retransmission request to a transmitting source of the received pulse train when a synchronization error is detected.

DETAILED DESCRIPTION OF THE INVENTION

Embodiments of the invented synchronization error detection circuit will now be described with reference to the attached drawings, in which like elements are indicated by like reference characters.

First Embodiment

Figure 1:
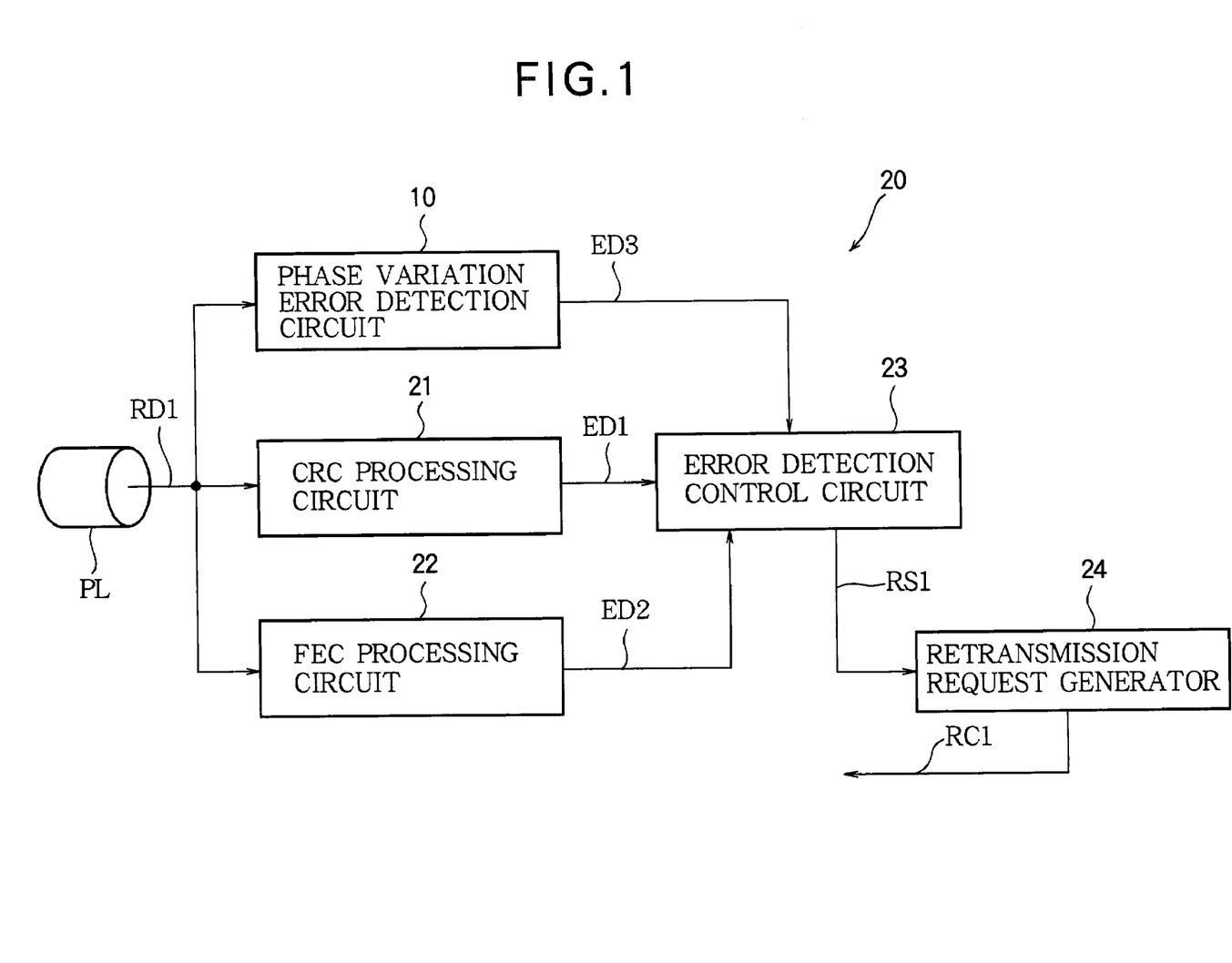
FIG. 1 is a block diagram schematically showing part of a communication device incorporating a phase variation error detection circuit embodying the present invention.

Referring to FIG. 1, the synchronization error detection circuit in the first embodiment is a phase variation error detection circuit 10 used in a communication apparatus 20 having a receiving function. The communication apparatus 20 also includes a CRC processing circuit 21, an FEC processing circuit 22, an error detection control circuit 23, a retransmission request generator 24, and other circuits, such as a clock recovery circuit (not shown), which are used in receiving data.

The communication apparatus 20 receives a data stream RD1 from a transmission channel such as a phone link PL. The received data stream RD1 is converted from analog to digital form and processed by various filters (not shown) and other necessary circuits, then supplied to the synchronization error detection circuit 10, CRC processing circuit 21, and FEC processing circuit 22. The transmission channel PL may be a wireless channel or a wireline channel, or a channel including both wireline and wireless sections. Components of the communication apparatus itself, including the filters and analog-to-digital converter, may be treated as part of the transmission channel PL.

The CRC processing circuit 21 uses the cyclic redundancy check method to detect data errors in the received data stream RD1. The FEC processing circuit 22 uses a forward error correction method to detect and correct data errors in the received data stream RD1.

Although the communication apparatus 20 in the first embodiment includes both CRC and FEC processing circuits, if necessary, one of the two circuits, either the CRC processing circuit 21 or FEC processing circuit 22, may be omitted, or replaced by a circuit using another error control method.

As will be described in more detail below, the phase variation error detection circuit 10 detects phase variations in the received data stream RD1. Such phase variations are a sign of imperfect synchronization and can lead to bit drop-ins and drop-outs. On detecting a large phase variation, the phase variation error detection circuit 10 supplies an error detection signal ED3 to the error detection control circuit 23.

The error detection control circuit 23 performs error control by controlling decoding operations according to the outputs from the CRC processing circuit 21, FEC processing circuit 22, and phase variation error detection circuit 10. More specifically, when the phase error detection signal ED3 is inactive, the outputs ED1 and ED2 from the CRC processing circuit 21 and FEC processing circuit 22 are used for error control; when the phase error detection signal ED3 is active, the outputs ED1 and ED2 from the CRC processing circuit 21 and FEC processing circuit 22 are ignored and a retransmission control signal RS1 is output. The retransmission control signal RS1 causes the retransmission request generator 24 to send a retransmission request signal RC1 to the communicating apparatus (not shown) that transmitted the received data stream RD1. This transmitting communication apparatus then sends a data stream with the same content as before. In the receiving communication apparatus 20, the retransmitted data become a newly received data stream RD1.

The reason for the operations described above is that when the phase error detection signal ED3 is inactive, the receiving communication apparatus 20 can normally recover an accurate clock signal from the received data stream RD1. The receiving communication apparatus 20 can thus maintain accurate synchronization with the transmitting communication apparatus, so the reliability of the outputs ED1 and ED2 from the CRC processing circuit 21 and FEC processing circuit 22 is high. When the phase error detection signal ED3 is active, however, synchronization between the transmitting communication apparatus and the receiving communication apparatus 20 is likely to be inaccurate, making the ED1 and ED2 outputs unreliable. In this case, it is safer to disable the FEC and CRC data error detection and correction functions and request retransmission.

If the synchronization problem that activated the phase error detection signal ED3 is temporary, the retransmitted data stream RD1 may be received without triggering another active phase error detection signal ED3 from the phase variation error detection circuit 10. In this case, since bit drop-ins and drop-outs are presumably absent, the outputs ED1 and ED2 from the CRC processing circuit 21 and FEC processing circuit 22 are presumed reliable and the error detection control circuit 23 controls the decoding operations according to them.

Figure 2:
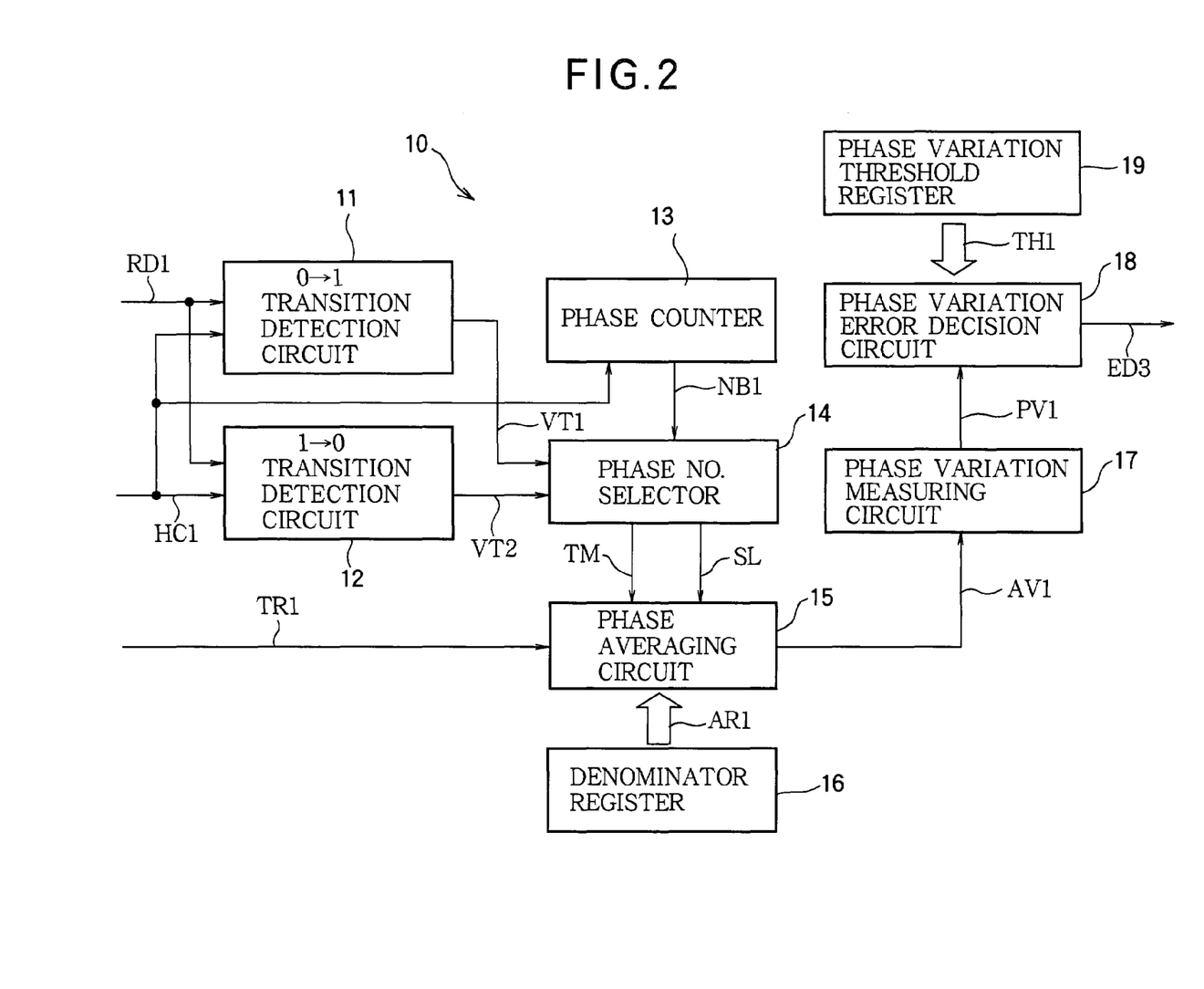
FIG. 2 is a block diagram schematically showing the main parts of the phase variation error detection circuit in FIG. 1.

FIG. 2 shows an exemplary structure of the phase variation error detection circuit 10. In this example, the phase variation error detection circuit 10 includes a pair of transition detection circuits 11, 12, a phase counter 13, a phase number selector 14, a phase averaging circuit 15, a denominator register 16, a phase variation measuring circuit 17, a phase variation error decision circuit 18, and a phase variation threshold register 19.

The transition detection circuits 11, 12 detect points of transition between the High level and the Low level in the received data stream RD1 (that is, rising and falling edges of the pulses in the pulse train constituting the received data stream RD1): transition detection circuit 11 detects transitions from zero to one (rising edges if positive logic is used, so that the High level is one and the Low level is zero); transition detection circuit 12 detects transitions from one to zero (falling edges if positive logic is used).

Figure 3:
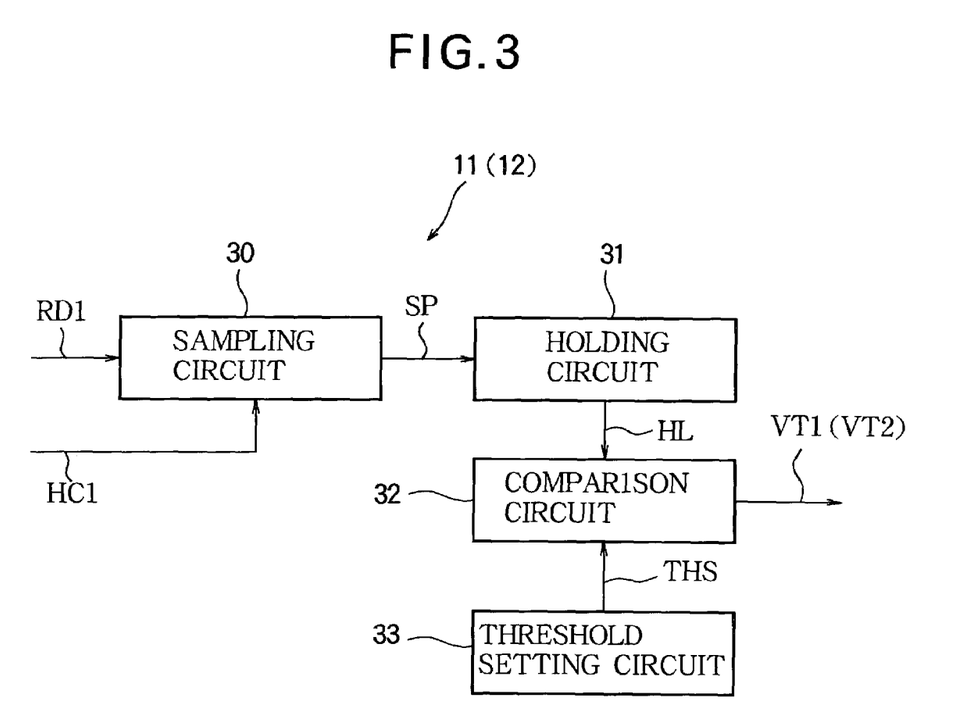
FIG. 3 is a block diagram schematically showing the main parts of the transition detection circuits in FIG. 2.

The functions of the transition detection circuits 11, 12 may be realized in various types of circuit structures. For example, the circuit structure shown in FIG. 3 may be used. The transition detection circuits 11 and 12 may have the same circuit structure; FIG. 3 will be described below as showing mainly transition detection circuit 11.

In FIG. 3, the transition detection circuit 11 includes a sampling circuit 30, a holding circuit 31, a comparison circuit 32, and a threshold setting circuit 33.

The sampling circuit 30 samples the received data stream RD1 by using a high-speed clock signal HC1, and outputs the sampled values or sampled potentials SP. The clock rate (the number of clock pulses per unit time) should be adequately higher than the data rate of the received data stream RD1 (the number of data pulses per unit time). In the first embodiment, the frequency of the high-speed clock signal HC1 is, for example, eight times the data rate of the received data stream RD1.

Figure 4:
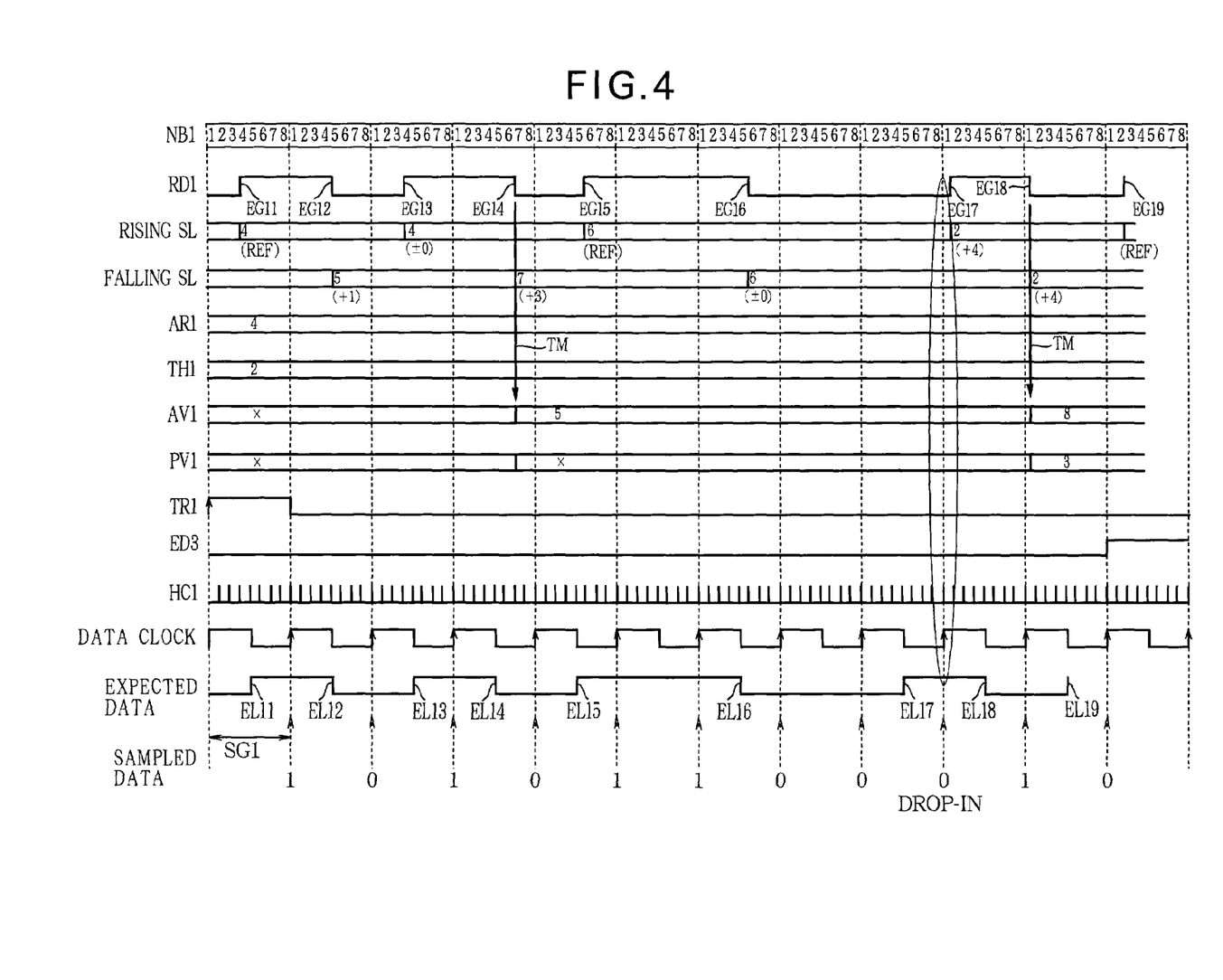
FIG. 4 is a timing diagram illustrating the operation of the phase variation error detection circuit.

This means, as can be seen in the NB1 and RD1 waveforms in FIG. 4, that one rising edge or one falling edge is generally detected during an interval in which the received data stream RD1 is sampled eight times. In FIG. 4, a Non Return to Zero (NRZ) channel code is used for the received data stream RD1.

The holding circuit 31 holds the sampled value SP, outputs the held value or held level HL, and varies the held value HL whenever the sampling circuit 30, operating according to the high-speed clock signal HC1, supplies a new sampled value SP.

The threshold setting circuit 33 outputs a preset threshold value THS.

The comparison circuit 32 compares the threshold value THS with the held value HL. The threshold value THS is lower than the High level of the data pulses, and higher than the Low level, with adequate margins between the High, THS, and Low levels.

Since the purpose of the transition detection circuit 11 is to detect rising edges in the received data stream RD1, when the held value HL goes above the threshold value THS, the comparison circuit 32 outputs a (rising) transition detection pulse VT1. In the transition detection circuit 12, the purpose of which is to detect falling edges, a (falling) transition detection pulse VT2 is output from the comparison circuit 32 when the held value HL goes below the threshold value THS.

The two transition-detection circuits 11, 12 may have the same general structure except for the comparison circuit 32. The transition detection circuits 11 and 12 may use different threshold values THS, however.

The phase counter 13 in FIG. 2 receives the same high-speed clock signal HC1 as is supplied to the transition detection circuits 11, 12, and counts cyclically in the integer range from one to eight. Starting from one, the count value NB1 is incremented (by +1) when each HC1 clock pulse is received, until the maximum value of eight is reached, after which the count value NB1 returns to the minimum value of one again on the next clock pulse.

The phase number selector 14 receives the transition detection signals VT1 and VT2 output from the transition detection circuits 11, 12, and the count value NB1 output from the phase counter 13. Each received transition detection pulse (VT1 or VT2) causes the phase number selector 14 to select and store the current count value NB1 as a phase number (indicating the phase of an edge). This selection constitutes the operation of associating a phase number with a rising or falling edge in the received data stream RD1.

The functions of the phase number selector 14 may be realized in various types of circuit structures. For example, the phase number selector 14 may have the circuit structure shown in FIG. 5, comprising a distribution circuit 40 and four registers 41–44.

Figure 5:
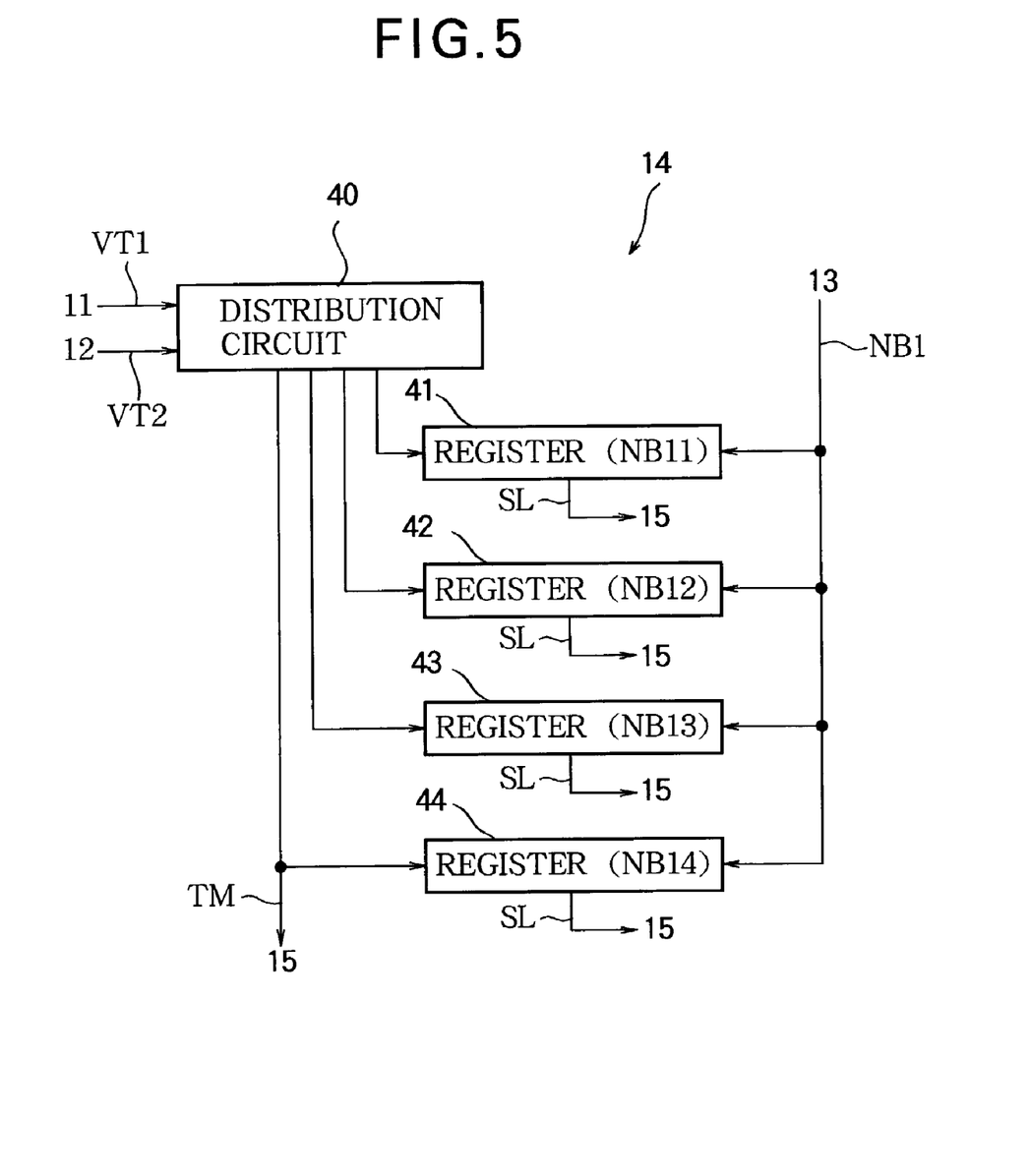
FIG. 5 is a block diagram schematically showing the main parts of a phase number selection circuit in FIG. 2.

Each of the registers 41–44 is, for example, a memory circuit comprising several parallel D-type flip-flops, having input terminals for receiving the count value NB1 connected in parallel to the phase counter 13 and output terminals connected in parallel to the phase averaging circuit 15. These flip-flops also receive the transition detection pulses VT1 and VT2 from the distribution circuit 40. Upon being triggered by a VT1 or VT2 pulse, a flip-flop latches the value (one bit of the count value NB1) currently received at its input terminal. The latched value is output from the output terminal of the flip-flop as one bit of a phase number, until the next VT1 or VT2 pulse is received and a new input value is latched. The distribution circuit 40 distributes the VT1 and VT2 pulses to the registers 41–44 in a predetermined order.

The D-type flip-flops may be structured to operate in synchronization with either the rising or falling edges of the VT1 and VT2 pulses. A detailed description will be omitted, as edge-triggered D-type flip-flops are well known.

In FIG. 4, the count value NB1 indicating the phase number is an integer ranging from one to eight, but this integer may be represented in the registers 41–44 as follows. If D indicates decimal notation and B indicates binary notation, then 1D may be represented as 000B, 2D as 001B, and 8D as 111B, so that the decimal range 1D–8D becomes the binary range 000B–111B, in which case each of the registers 41–44 can be a three-bit register (comprising three D-type flip-flops).

The distribution circuit 40 distributes the transition detection pulses VT1 and VT2 output from the transition detection circuits 11, 12 to the registers 41–44 one by one in a predetermined order, following the pulse output sequence. The predetermined order may be a cyclical order: for example, the distribution circuit 40 may send the first four transition detection pulses to registers 41, 42, 43, 44 in this order, and send the next transition detection pulse to register 41 again.

As rising edges alternate with falling edges in the received data stream RD1, if the distribution circuit 40 distributes the transition detection pulses VT1 and VT2 to the registers 41–44 as described above, the registers 41–44 will receive count values NB1 indicating the phases of rising and falling edges alternately. The count values NB1 latched in the registers 41–44 will always represent four consecutive edges in the received data stream RD1 (for example, edges EG11–EG14 in FIG. 4).

If the count values NB1 latched in the registers 41–44 are denoted NB11–NB14, respectively, then at a given time the count values NB11 and NB13 may indicate, for example, phase number four for rising edges EG11 and EG13, and the count values NB12 and NB14 may indicate, for example, phase numbers five and seven for falling edges EG12 and EG14, as is shown in FIG. 4.

Needless to say, the count values NB11–NB14 latched in the registers 41–44 may change as new transition detection pulses VT1 and VT2 are supplied from the distribution circuit 40.

The phase averaging circuit 15 receives the transition detection pulse (VT1 or VT2) supplied from the distribution circuit 40 to register 44 as a timing signal TM. The timing signal TM tells the phase averaging circuit 15 when to start the averaging operation described below.

The phase averaging circuit 15 in FIG. 2 reads the count values NB11–NB14 latched in the four registers 41–44 as phase numbers SL, executes an averaging operation according to the following equation (1), and outputs a phase average value AV1.

$$AV1 = \text{reference value} + (\text{difference-1} + \text{difference-2} + \text{difference-3})/\text{number of counts} \quad (1)$$

The reference value in this equation is the phase number SL given by the count value NB11 latched in register 41. The three differences are the differences between the reference value and the phase numbers SL given by the three count values NB12–NB14 latched in registers 42–44. In the averaging operation performed at the timing signal TM generated by edge EG14 in FIG. 4, for example, the reference value (REF) is the phase number of edge EG11 (NB11=4), and difference-1 is the difference between this reference value and the phase number of edge EG12 (NB12=5). Difference-1 is accordingly equal to one (5−4=1).

In the ideal case without any jitter (hence with no bit drop-outs or drop-ins), the received data stream RD1 should have the waveform labeled as expected data in FIG. 4, in which all rising and falling edges (EL11–EL19) have the same phase number (e.g., 5) as the first edge (EL11). This is possible because the frequency of the high-speed clock signal HC1 is an integer multiple of the data rate of the received data stream RD1 (the data rate is the frequency of the data clock in FIG. 4).

In an actual transmission channel, however, jitter generally causes the phase numbers of the edges to vary, as illustrated by the RD1 waveform in FIG. 4. If the jitter is moderate and the phase variation is not too large, the data sampling points at the rising edges in the data clock are still located near the middle of the High and Low bit intervals in the received data stream RD1, so accurate samples are obtained and the correct '1' and '0' data values are recognized. In this case, the communication apparatus 20 can stay in synchronization with the transmitting communication device, thereby maintaining proper communication. If the jitter is excessive and the phase variation is large, however, bit drop-ins or drop-outs may occur.

The phase average value AV1 indicates the average jitter in the transmission channel PL over an interval including four edges. The phase variation error detection circuit 10 in the first embodiment can detect excessive jitter regardless of whether it leads to a bit drop-in or drop-out.

The phase averaging circuit 15 must first be activated by the trigger signal TR1 shown in FIG. 4, which is a timing signal that starts the phase jitter measurement process. After receiving a rising edge of the trigger signal TR1, the phase averaging circuit 15 is ready to start the averaging operation at any time. The averaging operation actually starts when the timing signal TM is supplied.

Incidentally, the phase averaging circuit 15 can be structured so that only one of the two signals, either the trigger signal TR1 or the timing signal TM, is necessary. If the effect of jitter is considered, use of the timing signal TM, which indicates that the count values NB11–NB14 for the four consecutive edges needed for an averaging operation are latched in the registers 41–44, leads to efficient implementations of the phase number selector 14 and the phase averaging circuit 15.

The equation (1) above is given to facilitate understanding of the averaging operation. In actual implementations, the calculations shown in the equation (1) can be optimized for more efficient processing by hardware or software in the phase averaging circuit 15. For example, subtracting the reference value three times from the sum of the phase numbers in registers 42–44, instead of adding three differences obtained one by one, may lead to higher processing efficiency (or space efficiency), because the three differences do not have to be latched temporarily during the averaging process.

The number of counts AR1 (AR1=4 in FIG. 4) used as a denominator in equation (1) is prestored in the denominator register 16. The phase averaging circuit 15 can read the number of counts AR1 from the denominator register 16 at any time.

The phase variation measuring circuit 17, which receives the phase average value AV1 from the phase averaging circuit 15, is a subtractor that detects and outputs a phase variation value PV1 as the absolute value of the difference between two consecutive phase average values AV1.

The phase variation error decision circuit 18 compares the phase variation value PV1 with a threshold value TH1 (TH1=2 in FIG. 4) supplied from the phase variation threshold register 19. If the phase variation value PV1 is greater than the threshold value TH1, the phase variation error decision circuit 18 activates the phase error detection signal ED3. The threshold value TH1 thus defines the maximum allowable phase variation PV1. The threshold value TH1 is prestored in the phase variation threshold register 19.

The functions of the phase averaging circuit 15, phase variation measuring circuit 17 and phase variation error decision circuit 18 can be realized in hardware with simple combinatorial logic circuits, or in software using general-purpose registers, a RAM work area, and a general-purpose operation unit.

The data clock in FIG. 4 is, in a narrow sense, a decoding clock, since the received data stream RD1 is sampled at the rising edges in the data clock to identify '1' and '0' data values. Constituent elements 11–13 and 11–19 in the phase variation error detection circuit 10 in FIG. 2 operate according to the high-speed clock signal HC1, and do not need to receive the data clock. If necessary, however, the data clock may be supplied to elements 15–18.

The operation in the first embodiment of the phase variation error detection circuit, having the structure described above, will be described below with reference to the timing waveforms in FIG. 4.

The phase variation error detection circuit 10 starts operating when the trigger signal TR1 is supplied to the phase averaging circuit 15 while, for example, the RD1 waveform in FIG. 4 is being received.

In the communication apparatus 20 shown in FIG. 1, the phase variation error detection circuit 10, CRC processing circuit 21, and FEC processing circuit 22 may always operate concurrently. Alternatively, normally only the CRC processing circuit 21 and FEC processing circuit 22 may operate, the phase variation error detection circuit 10 being triggered when communication quality is degraded.

In any case, the phase variation error detection circuit 10 starts effective operation when the trigger signal TR1 is supplied. Constituent elements 11–14 in the phase variation error detection circuit 10 may also operate before the trigger signal TR1 is supplied to the phase averaging circuit 15.

In FIG. 4, time flows from left to right. Accordingly, the transition detection circuits 11, 12 receive edges EG11–EG19 in the data stream RD1 in this order. When rising edges EG11, EG13, EG15 etc. are detected, transition detection circuit 11 outputs a transition detection pulse VT1; when falling edges EG12, EG14, EG16 etc. are detected, transition detection circuit 12 outputs a transition detection pulse VT2.

As illustrated by the RD1 waveform in FIG. 4, the first detected edge is rising-edge EG11, at which a transition detection pulse VT1 is supplied from the transition detection circuit 11 to the phase number selector 14. Following the predetermined order, the distribution circuit 40 in the phase number selector 14 distributes this VT1 pulse to register 41, so the count value NB1 (phase number 4 in FIG. 4) output from the phase counter 13 at this instant is latched in register 41 as count value NB11. The phase number given by the count value NB11 is the reference value in the averaging operation in equation (1).

The next detected edge is a falling edge EG12, at which a transition detection pulse VT2 is supplied from the transition detection circuit 12 to the phase number selector 14. Following the same predetermined order, the distribution circuit 40 in the phase number selector 14 distributes this VT2 pulse to register 42, so the count value NB1 (phase number 5 in FIG. 4) output from the phase counter 13 at this instant is latched in register 42 as count value NB12. The difference between the reference value and the phase number given by count value NB12 is difference-1 in the averaging operation in equation (1).

Similarly, when transition detection pulses VT1 and VT2 for edges EG13 and EG14 are supplied from the transition detection circuits 11, 12, the distribution circuit 40 distributes them to registers 43, 44, still following the predetermined order. The count values NB1 in the phase counter 13 at the times of these two edges are latched in registers 43, 44 as count values NB13 and NB14 (phase numbers 4 and 7 in FIG. 4).

The fourth transition detection pulse (VT2) is supplied simultaneously to register 44 and to the phase averaging circuit 15. The phase averaging circuit 15 receives this VT2 pulse as a timing signal TM, recognizes that the count values NB11–NB14 of the four edges needed for execution of the averaging operation in equation (1) have been latched in the registers 41–44, reads the count values NB11–NB14 as phase numbers SL, executes the averaging operation, and outputs the calculated phase average value AV1.

The phase numbers of the count values NB11–NB14 are:
(NB11, NB12, NB13, NB14)=(4, 5, 4, 7)
In equation (1), these values become:

$$4+(1+0+3)/4=5$$

Accordingly, the phase average value AV1 is 5. This phase average value AV1 (=5) is the first phase average value supplied to the phase variation measuring circuit 17, so the phase variation measuring circuit 17 merely stores the phase average value AV1.

For the four edges EG15–18 following edges EG11–14, the operation described above is repeated in the transition detection circuits 11, 12, phase counter 13, phase number selector 14, and phase averaging circuit 15.

As can be seen from the NB1 and RD1 waveforms in FIG. 4, the phase numbers of the count values NB11–NB14 for edges EG15–EG18 differ from the phase numbers of the count values for edges EG11–EG14. NB11–NB14 are now given as follows.
(NB11, NB12, NB13, NB14)=(6, 6, 2, 2)
Equation (1) now becomes:

$$6+(0+4+4)/4=8$$

Accordingly, the phase average value AV1 is 8. When this phase average value AV1 (=8) is supplied from the phase averaging circuit 15 to the phase variation measuring circuit 17, the phase variation measuring circuit 17 calculates the difference between it and the phase average value AV1 (=5) for the preceding four edges EG11–EG14, and outputs the difference as a phase variation value PV1 (PV1=8−5=3).

When the phase variation value PV1 (=3) is supplied to the phase variation error decision circuit 18, the phase variation error decision circuit 18 compares it with the threshold value TH1 (=2) stored in the phase variation threshold register 19. In this case, the phase variation value PV1 is greater than the threshold value TH1, so the phase variation error decision circuit 18 activates the phase error detection signal ED3 by driving it to the High logic level as shown in FIG. 4, thereby informing the error detection control circuit 23 of a synchronization error. This synchronization error is accompanied by a bit drop-in just before edge EG17.

As described above, when the error detection control circuit 23 in FIG. 1 receives the active phase error detection signal ED3, the error detection control circuit 23 ignores the outputs ED1 and ED2 from the CRC processing circuit 21 and FEC processing circuit 22 and outputs a retransmission control signal RS1. The retransmission request generator 24 then sends a retransmission request signal RC1.

When the phase error detection signal ED3 is activated, the operations in the phase variation error detection circuit 10 may either stop or continue. If the operations continue without stopping, then when the next phase average value AV1 is supplied, the phase variation measuring circuit 17 operates in the same way, subtracting the preceding phase average value AV1 (=8) to obtain a difference PV1 for comparison with the threshold value TH1.

The number of consecutive edges used in the averaging operation can be increased or decreased by varying the number of counts AR1.

According to the first embodiment, the phase variation error detection circuit can accurately detect synchronization errors that have a high probability of producing wrong indications from the CRC processing circuit 21 and FEC processing circuit 22. The phase variation error detection circuit can thereby limit the effect of the wrong indications, eliminate reliability gaps in error detection, maintain communication quality, and assure communication reliability.

The synchronization errors that the phase variation error detection circuit in the first embodiment can detect include not only the bit drop-outs and drop-ins described above but also excessive jitter.

Second Embodiment

Figure 6:
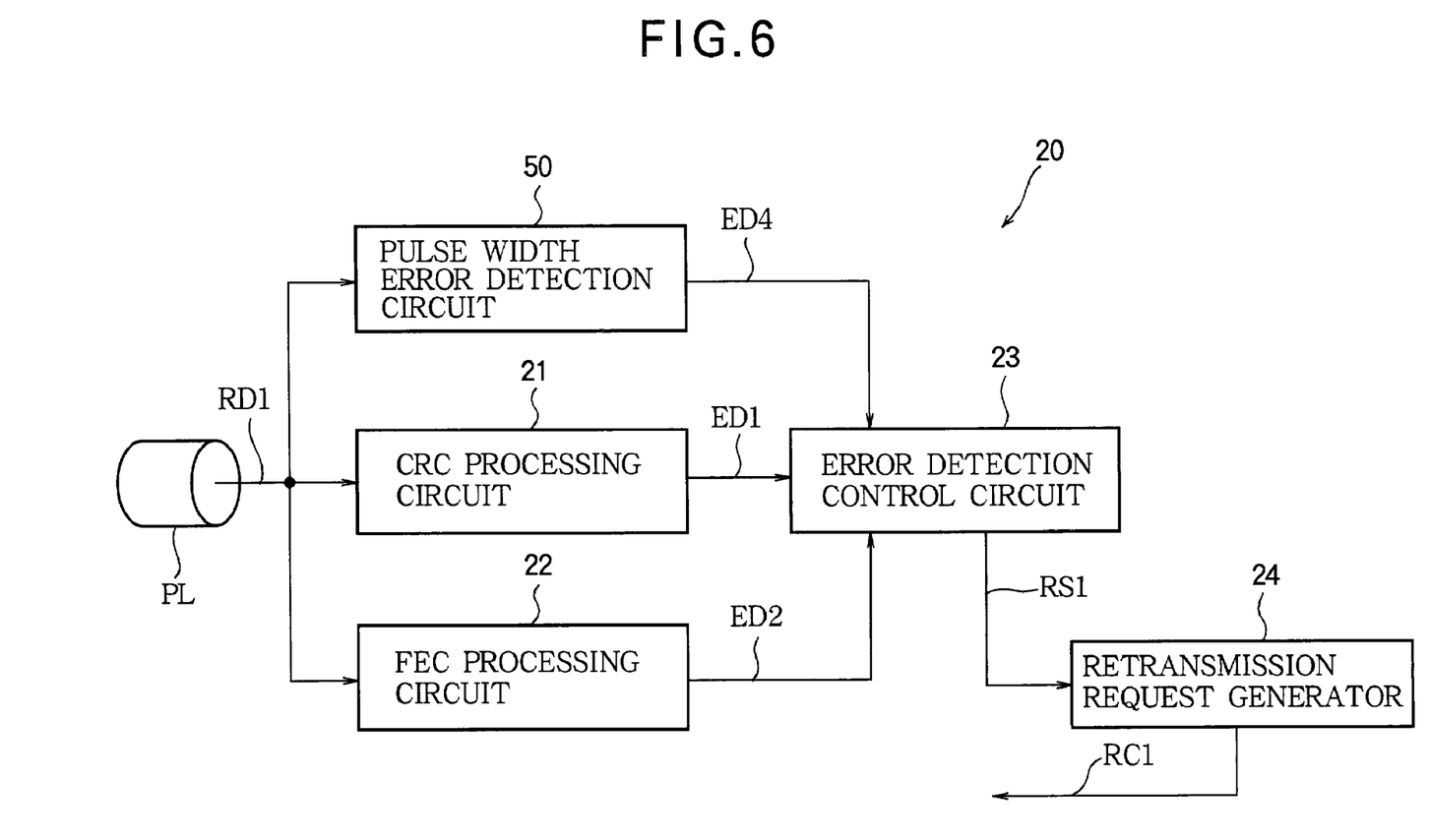
FIG. 6 is a block diagram schematically showing part of a communication device incorporating a pulse width error detection circuit embodying the present invention.

Referring to FIG. 6, the second embodiment replaces the phase variation error detection circuit of the first embodiment with a pulse width error detection circuit 50. The differences between the pulse width error detection circuit in the second embodiment and the phase variation error detection circuit in the first embodiment will be described below.

Figure 7:
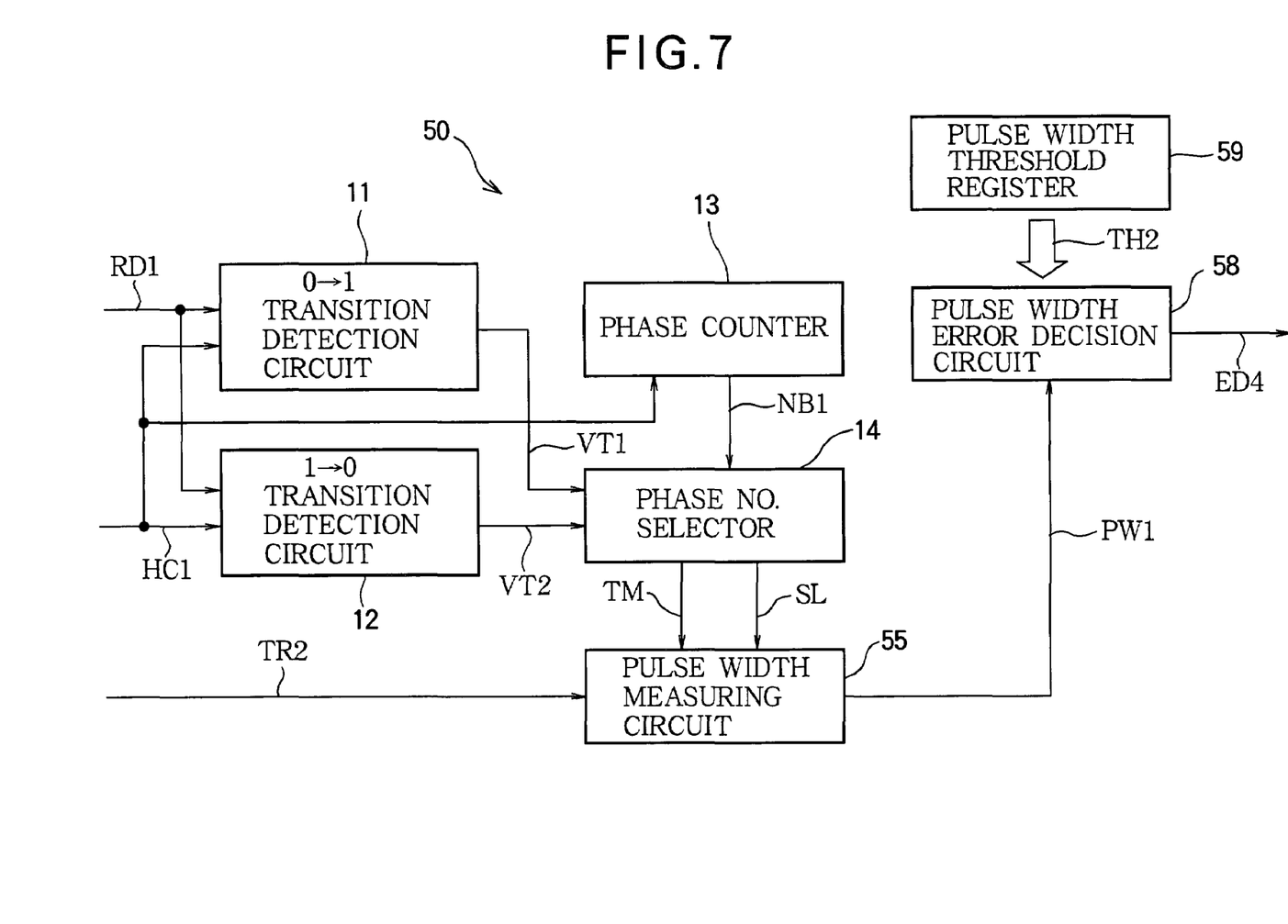
FIG. 7 is a block diagram schematically showing the main parts of the pulse width error detection circuit in FIG. 6.

FIG. 7 shows an exemplary structure of the pulse width error detection circuit in the second embodiment, using the same reference characters as in FIG. 2 for similar elements. The pulse width error detection circuit 50 includes several of the same circuit elements as the phase variation error detection circuit 10 in the first embodiment, but differs from the phase variation error detection circuit by replacing the phase averaging circuit 15 with a pulse width measuring circuit 55, the phase variation error decision circuit 18 with a pulse width error decision circuit 58, and the phase variation threshold register 19 with a pulse width threshold register 59, and by eliminating the denominator register 16 and phase variation measuring circuit 17.

The pulse width error detection circuit 50 in the second embodiment is used in the communication apparatus 20 in the same way as the phase variation error detection circuit 10 in the first embodiment.

Figure 8:
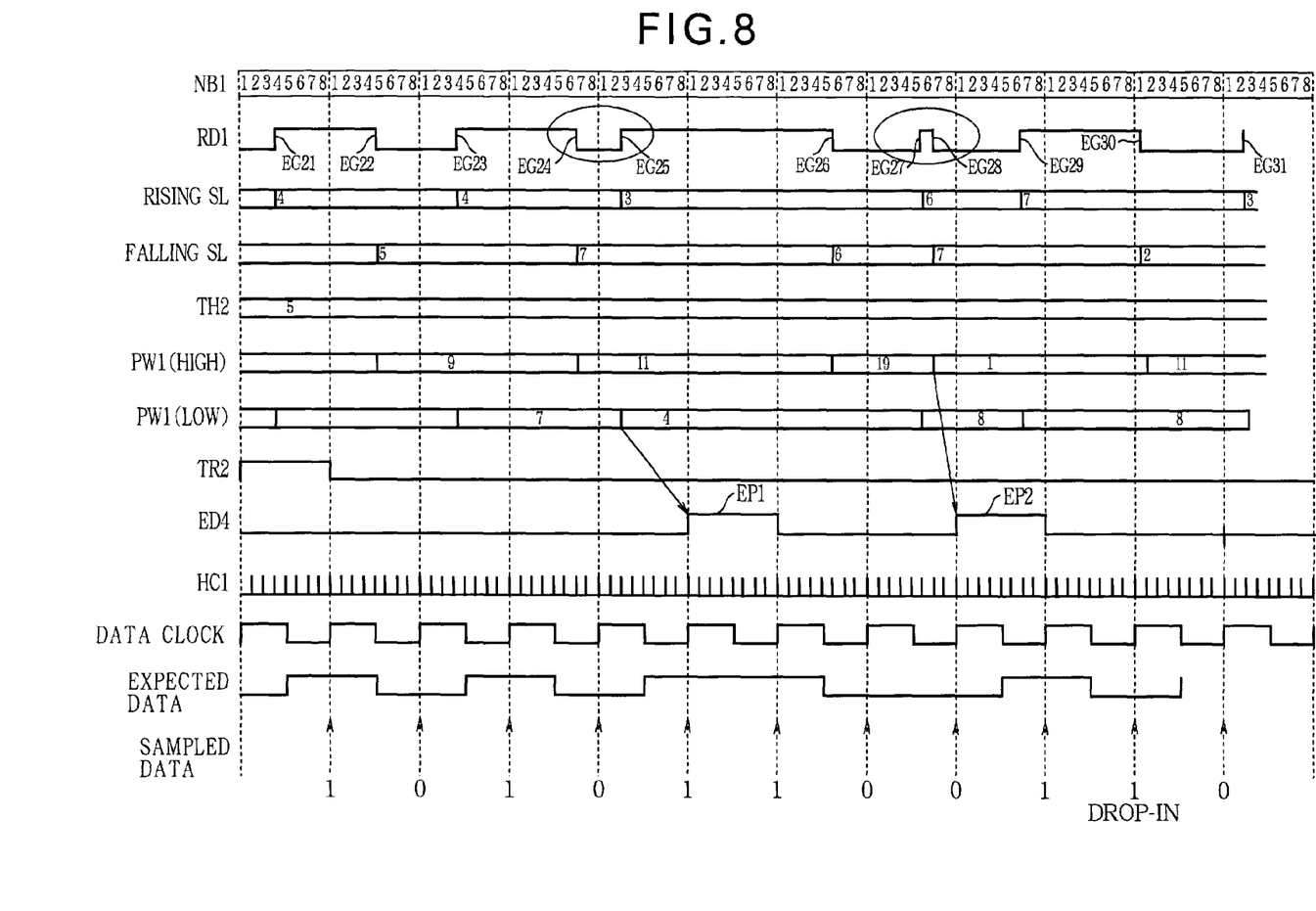
FIG. 8 is a timing diagram illustrating the operation of the pulse width error detection circuit.

FIG. 8 is a timing diagram illustrating the operation of the second embodiment. The received data stream RD1 uses the same NRZ channel code as in the first embodiment and the high-speed clock signal HC1 has the same frequency, equal to eight times the data rate, but for purposes of illustration, the RD1 waveform in FIG. 8 differs from the RD1 waveform in FIG. 4. The RD1 waveforms in FIGS. 4 and 8 may be considered to represent different sections of the same RD1 data stream.

Since the RD1 waveforms in FIGS. 4 and 8 differ, the phase numbers SL of the rising and falling edges differ.

Whereas the phase averaging circuit 15 in the first embodiment takes a phase average value AV1 over four consecutive edges, the pulse width measuring circuit 55 in the second embodiment determines the difference between two consecutive edges. This difference is the width of a High or Low pulse, that is, the duration of a high or low interval in the RD1 waveform.

The phase averaging circuit 15 in the first embodiment has to wait for the count values of four consecutive edges to be latched in registers 41–44 before executing an averaging operation, but the pulse width measuring circuit 55 in the second embodiment can determine a High or Low pulse width when any two consecutive edges have been latched.

The nominal duty cycle in FIG. 8 is 50%, as illustrated by the expected data waveform. The basic Low pulse width and the High pulse width are theoretically the same, so synchronization errors can be detected without discriminating between the two types of pulses. To calculate and output a High or Low pulse width, the pulse width measuring circuit 55 only has to determine the difference between the latched phase numbers of any two consecutive edges.

Therefore, the phase number selector 14 in the second embodiment needs only two registers, instead of four registers 41–44. Whenever a new phase number is latched in either one of the two registers, the phase number selector 14 executes a pulse width measurement according to equation (2) below and outputs the measured pulse width PW1. As an exception, the first time a new phase number is latched after operation starts, the pulse width measurement is not performed, because the phase number selector 14 has to wait until a second phase number has been latched.

$$PW1 = \text{new phase number} - \text{preceding phase number} + N \times (\text{maximum phase number}) \quad (2)$$

The maximum phase number in this equation is eight, the maximum value in the range from one to eight of the count value NB1. The preceding phase number is the phase number latched earlier in one of the two registers in the phase number selector 14; the new phase number is the phase number latched later in the other one of the two registers. N is the number of times the phase counter 13 is reset to one between the latching of these two phase numbers.

When the phase number (4) of the first edge EG21 and the phase number (5) of the second edge EG22 in the received data stream RD1 shown in FIG. 8 are latched in the two registers in this order as a preceding phase number and a new phase number, for example, equation (2) becomes:

$$PW1 = 5 - 4 + (1 \times 8) = 9$$

This pulse width PW1 (=9) is the first High pulse width PW1 in FIG. 8.

Similarly, when the phase number (4) of the third edge EG23 is latched in the register in which the phase number (4) of the first edge EG21 was latched earlier, the phase number (4) of the third edge EG23 becomes the new phase number, and the phase number (5) of the second edge EG22, which was formerly the new phase number, becomes the preceding phase number. Equation (2) now becomes:

$$PW1 = 4 - 5 + (1 \times 8) = 7$$

This pulse width PW1 (=7) is the first Low pulse width PW1 in FIG. 8.

Whenever a new phase number is latched in either one of the registers, the operation described above is repeated: the pulse width is calculated according to equation (2) and output as pulse width PW1. High and Low pulse widths PW1 are obtained alternately as shown in FIG. 8.

In the second embodiment, the threshold value TH2 that defines the minimum allowable pulse width is stored in the pulse width threshold register 59, and the pulse width error decision circuit 58 compares the pulse width PW1 obtained by the pulse width measuring circuit 55 with the threshold value TH2. When a pulse width PW1 less than the threshold value TH2 is observed, the pulse width error decision circuit 58 outputs a pulse width error detection signal ED4, indicating a synchronization error, to the error detection control circuit 23.

In the general case, the pulse width error detection circuit may include structures for storing a threshold value defining a maximum allowable pulse width PW1 and outputting a pulse width error detection signal when a pulse width PW1 exceeding this threshold value is obtained. In the second embodiment, however, the received data stream RD1 uses an NRZ channel code, so long pulses may occur normally (theoretically, the pulse width PW1 may be infinitely long). The pulse width error detection circuit therefore uses only a threshold value TH2 defining the minimum pulse width PW1.

If the received data stream RD1 is encoded using a return-to-zero (RZ) channel code, for example, then the threshold value TH2 may define either a maximum or a minimum allowable pulse width PW1.

In the second embodiment, the threshold value TH2 that defines the minimum allowable pulse width PW1 is five, as shown in FIG. 8. Accordingly, when a pulse width PW1 less than five is obtained, the pulse width error detection signal ED4 is activated.

In FIG. 8, the pulse width error detection signal ED4 is activated twice, during periods EP1 and EP2. The first activation (EP1) is due to a duty cycle error: the Low pulse width between edges EG24 and EG25 (PW1=4) is less than the threshold value (TH2=5). The second activation (EP2) is due to noise, which appears as a narrow High pulse between edges EG27 and EG28 (PW1=1). Although this noise pulse is not sampled in FIG. 8, if it coincided with a rising edge of the data clock, it would be sampled, causing a data error. The detected synchronization errors (EP1 and EP2) do not by themselves cause either a bit drop-in or drop-out, but they are symptomatic of unstable channel conditions that can easily lead to a bit drop-in or drop-out, as in fact happens shortly after the second synchronization error (EP2) is signaled, when falling edge EG30 is delayed.

When the pulse width error detection circuit 50 activates the pulse width error detection signal ED4, the error detection control circuit 23 may operate in the same way as when a phase error detection signal ED3 is output in the first embodiment, by ignoring the outputs ED1 and ED2 of the CRC and FEC processing circuits and activating the retransmission control signal RS1.

Although the pulse width error detection circuit in the second embodiment differs from the phase variation error detection circuit in the first embodiment, it produces similar effects. Since the pulse width error detection circuit in the second embodiment can determine whether the pulse width between two consecutive edges is correct or not, however, the pulse width error detection circuit can detect synchronization errors more rapidly than can the phase variation error detection circuit in the first embodiment, which requires four edges to obtain a phase average value AV1 and outputs a difference between two phase average values.

As described above, even under conditions in which existing methods of error control (such as the CRC and FEC methods) are likely to give wrong indications, the present invention can override these wrong indications, thereby maintaining communication quality and assuring communication reliability.

In the first embodiment, the phase averaging circuit 15 executed an averaging operation on the count values of four consecutive edges. If rapid detection of synchronization errors is not essential, however, it is permissible to skip edges. Substantially the same effect as described above is obtained if the averaging operation is executed on the count values of every other edge (ignoring edges EG12, EG14, EG16 in FIG. 4), for example, or every third edge. Edges may also be skipped in the second embodiment.

The communication apparatus 20 may include both the phase variation error detection circuit 10 of the first embodiment and pulse width error detection circuit 50 of the second embodiment. In this case, a synchronization error may be recognized from, for example, the output of an error detection signal ED3 or ED4 from either one of the phase variation error detection circuit 10 or the pulse width error detection circuit 50.

In the second embodiment, the duty cycle in the received data stream RD1 is 50%. If the duty cycle is not 50%, in other words, if the High pulse width and the Low pulse width theoretically differ, the pulse width measuring circuit 55 may discriminate between the two types of pulses, and calculate and output separate High and Low pulse widths. Two threshold values are then required, one for the High pulse width and one for the Low pulse width. When a High pulse width PW1 is calculated and output, the pulse width error decision circuit 58 compares it with the threshold value for the High pulse width; when a Low pulse width PW1 is calculated and output, the pulse width error decision circuit 58 compares it with the threshold value for the Low pulse width.

There may be two modes of communication between the transmitting communication apparatus and the receiving communication apparatus 20: a first communication mode emphasizing transmission speed more than transmission quality, and a second communication mode emphasizing transmission quality more than transmission speed. In this case, the following mode selection scheme may be effective: the frequency of activation of phase error detection signals ED3 and/or pulse width error detection signals ED4 is compared with a predetermined threshold value; if the frequency is less than the threshold value, communication is carried out in the first communication mode; if the frequency is greater than the threshold value, the channel PL is considered to be unstable, and the mode is switched from the first communication mode to the second communication mode to obtain improved transmission quality. After the mode is switched to the second communication mode, the frequency of activation of signals ED3 and/or ED4 continues to be monitored and compared with the threshold value, and if the frequency returns to a value less than the threshold value, the mode is returned to the first communication mode.

The frequency of activation of signals ED3 and/or ED4 may be detected and compared with a threshold value by either hardware or software. Since it is not necessary to detect the frequency of activation of the ED3 and/or ED4 signals as often as it is necessary to perform the averaging operation and pulse width calculation operation, the activation frequency detection function can normally be realized in software. If this function can be realized in either hardware or software, then software is generally preferable for flexibility and extensibility.

The invention as a whole is realized in hardware in the description above, but the invention as a whole can be also realized in software.

Those skilled in the art will recognize that further variations are possible within the scope of the invention, which is defined in the appended claims.

What is claimed is:

1. A synchronization error detection circuit for detecting errors due to faulty synchronization with a received pulse train, comprising:

a transition detector for detecting rising or falling transitions of pulses constituting the received pulse train;

a cyclic number generator for generating numbers that repeat cyclically over a predetermined time corresponding to a rate at which said pulses arrive in the received pulse train;

a selector for selecting a number generated by the cyclic number generator when a transition is detected by the transition detector, thereby associating the selected number with the detected transition; and a synchronization error detector for using the numbers selected by the selector to calculate average values over groups of transitions, and for comparing successive average values thus calculated with each other, thereby detecting synchronization errors.

2. The synchronization error detection circuit of claim 1, wherein the synchronization error detector includes a decision circuit that compares a difference between said successive average values with a predetermined threshold value, a synchronization error being detected when the difference exceeds the predetermined threshold value.

3. The synchronization error detection circuit of claim 1, wherein the synchronization error detector includes an averaging circuit that, for each group of transitions among said groups of transitions, takes differences between the selected number associated with a first transition in the group and the selected numbers associated with the subsequent transitions in the group, adds said differences to obtain a sum, divides the sum by the number of transitions in the group to obtain a quotient, and adds the quotient to the selected number associated with the first transition in the group.

4. The synchronization error detection circuit of claim 1, further comprising a retransmission request generator for sending a retransmission request to a transmitting source of said received pulse train when a synchronization error is detected.

5. The synchronization error detection circuit of claim 2, further comprising a redundancy checking circuit for detecting data errors in the received pulse train, wherein the synchronization error detection circuit disables the redundancy checking circuit when the synchronization error detector detects a synchronization error.

6. A method of detecting synchronization errors in a received pulse train, comprising:

detecting rising or falling transitions of pulses constituting the received pulse train;

generating phase numbers that repeat cyclically over a predetermined time corresponding to a rate at which said pulses arrive in the received pulse train;

selecting the phase number generated when each transition is detected, thereby associating the selected phase number with the detected transition; and using the selected phase numbers to calculate average values over groups of transitions; and comparing successive average values thus calculated with each other, thereby detecting synchronization errors.

7. The method of claim 6, wherein the predetermined operation further comprises:

taking a difference between a pair of said successive average values; and comparing said difference with a predetermined threshold value, a synchronization error being detected when the difference exceeds the predetermined threshold value.

8. The method of claim 6, wherein using the selected phase numbers to calculate average values further comprises, for each group of transitions among said groups of transitions:

taking differences between the selected phase number associated with a first transition in the group and the selected phase numbers associated with the subsequent transitions in the group;

adding said differences to obtain a sum;

dividing said sum by the number of transitions in the group to obtain a quotient; and adding the quotient to the selected number associated with the first transition in the group.

9. The method of claim 6, further comprising sending a retransmission request to a transmitting source of said received pulse train when a synchronization error is detected.

10. The method of claim 6, further comprising disabling detection of data errors in the received pulse train when a synchronization error is detected.

11. The method of claim 6, further comprising disabling correction of data errors in the received pulse train when a synchronization error is detected.

12. The method of claim 6, further comprising:

selecting a first communication mode when the synchronization error detector detects synchronization errors less frequently than a predetermined threshold rate; and selecting a second communication mode when the synchronization error detector detects synchronization errors more frequently than the predetermined threshold rate, wherein the first communication mode emphasizes transmission speed more than transmission quality, and wherein the second communication mode emphasizes transmission quality more than transmission speed.

* * * * *